US005627902A

United States Patent [19]
Ziarati

[11] Patent Number: 5,627,902
[45] Date of Patent: *May 6, 1997

[54] MAGNETIC RESONANCE IMAGING COMPATIBLE AUDIO HEADSET

[75] Inventor: Mokhtar Ziarati, Calabasas, Calif.

[73] Assignee: Resonance Technology, Inc., Van Nuys, Calif.

[*] Notice: The term of this patent shall not extend beyond the expiration date of Pat. No. 5,412,419.

[21] Appl. No.: 284,838

[22] Filed: Aug. 2, 1994

Related U.S. Application Data

[63] Continuation of Ser. No. 653,711, Feb. 11, 1991, Pat. No. 5,412,419.

[51] Int. Cl.$^6$ .................................................. H04R 25/00
[52] U.S. Cl. ........................... 381/187; 381/189; 181/129; 181/130
[58] Field of Search ................... 348/61, 77, 162; 128/653 R, 653 A, 653 AF, 653 SC, 653.1, 653.2; 324/318, 322; 381/94, 88, 90, 154, 159; 181/129, 130, 131, 135, 137, 183, 187, 189; H04N 7/18; H04R 25/00

[56] References Cited

U.S. PATENT DOCUMENTS

| | | | |
|---|---|---|---|
| Re. 34,219 | 4/1993 | Lederer | 381/90 |
| 3,810,525 | 5/1974 | Crenna | 381/183 |
| 4,170,275 | 10/1979 | Larsen | 181/129 |
| 4,347,911 | 9/1982 | Bertagna et al. | 181/130 |
| 4,542,803 | 9/1985 | Houng | 181/129 |
| 4,588,868 | 5/1986 | Bertagna et al. | 181/129 |
| 5,076,275 | 12/1991 | Bechor et al. | 128/653.2 |
| 5,277,184 | 1/1994 | Messana | 128/653.5 |

OTHER PUBLICATIONS

Cover page, selected pages of General Electric parts list and Operator Intercom Assembly diagram (oversize copy), dated 1986.
AMP Incorporated RF Filter specification, dated Apr. 19, 1987.
"Simple Music/Audio System for Patients Having MR Imaging," written by Alan T. Miyamoto and R. Tim Kasson of Glendale Adventist Medical Center, Nov. 1988 edition of the American Journal of Roentgenology.
Copy of Oct. 5, 1994 jury verdict form in *Magnacoustics, Inc., Vs. Resonance Technology Co., Mokhtar Ziarati and Susana Ziarati*, holding invalid claims 6, 9 and 12 of U.S. Pat. No. 34,219 to Lederer in view of the above prior art and applicant's prior sale activities.

*Primary Examiner*—Michael H. Lee
*Attorney, Agent, or Firm*—Wilson, Sonsini, Goodrich & Rosati

[57] ABSTRACT

A headset is provided for an audio and video system that is compatible with the strong magnetic fields generated by Magnetic Resonance Imaging equipment. In the system, the audio portion of the signal is passed through an amplifier and appropriate RF filters and chokes, and fed into a pneumatic transducer inside the magnet room. A headset having an inner set (portion) connects the output of the pneumatic transducer to the patient's ear, while an outer set covers the patient's ear to block out gradient knocking noises.

8 Claims, 3 Drawing Sheets

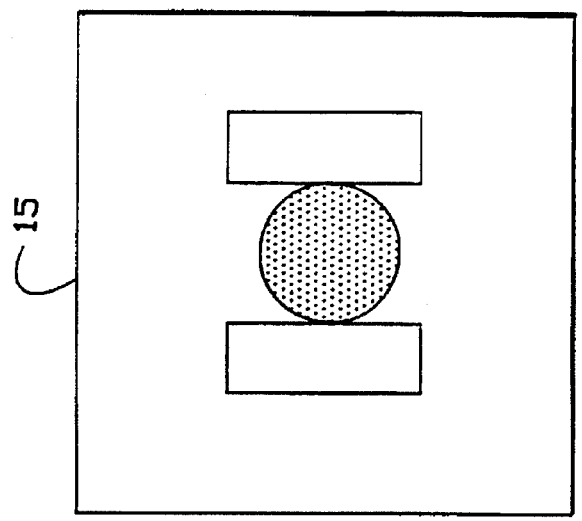
FIG. 6B
FIG. 5
FIG. 6A
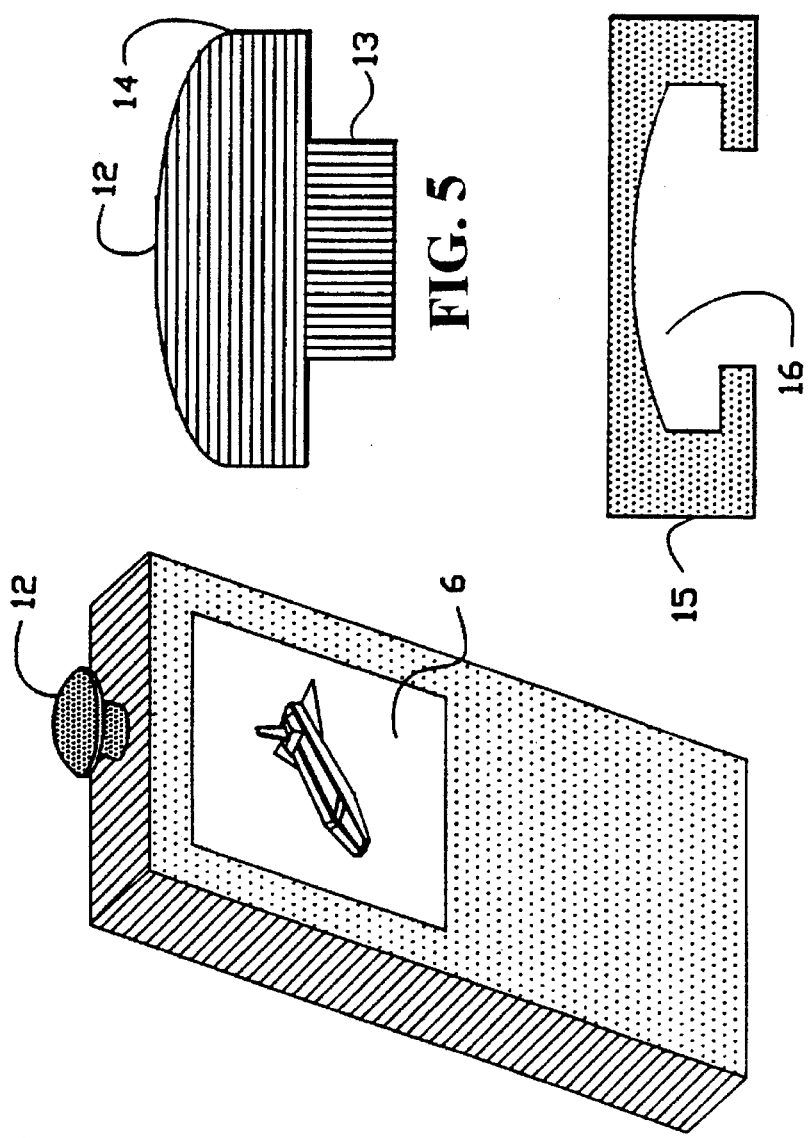
FIG. 4

MAGNETIC RESONANCE IMAGING COMPATIBLE AUDIO HEADSET

CROSS REFERENCE TO RELATED APPLICATIONS

This application is a continuation of U.S. application Ser. No. 07/653,711, filed Feb. 11, 1991, now U.S. Pat. No. 5,412,419.

BACKGROUND OF THE INVENTION

1. Field of the Invention

The present invention relates to the field of magnetic resonance imaging equipment. More precisely, the present invention relates to an audio and video system including a liquid crystal display that is not disrupted by strong magnetic fields created by Magnetic Resonance Imaging devices.

2. Description of the Prior Art and Related Information

Magnetic Resonance Imaging (i.e., "MRI") is a relatively new scanning procedure being used in the medical community extensively. MRI is a valued technique for assisting doctors diagnose numerous medical ailments. The scanning procedure requires that a patient lie still inside a tunnel shaped enclosure called the bore. The MRI device uses a strong magnetic field that is generated around the patient's body. Disturbances in the field due to the presence of the body can be detected and translated into images displayed on a viewing screen.

MRI technology involves very sophisticated hardware. The most prominent piece of hardware is a large magnet that induces a strong, uniform, and static magnetic field. Generally, the magnetic field ranges from 0.5 Tesla to 2.0 Tesla inside the bore. Gradient coils disposed around the bore induce spatially variant magnetic fields (i.e., gradients) that modify the existing uniform magnetic field. To induce nuclear resonance, a transmitter emits radio waves through a coil, which coil couples the radio wave energy with the resonating nuclei inside the magnetic field. A receiver, also connected to the coil, receives the disrupted electromagnetic waves. The waves are filtered, amplified, and processed into visual data for viewing by an MRI technologist attending to the procedure. More detailed information regarding MRI equipment is available in a book entitled *Nuclear Magnetic Resonance*, pp. 53–66 (1st ed. 1981), the contents of which are incorporated by reference.

As useful as an MRI scanning procedure is, it exacts a toll on the patient. For example, on many occasions patients cannot complete the exam due to claustrophobia caused by having to lie prone inside the bore for a long time while the procedure takes place. To be sure, the procedure is rather long in duration, lasting about half an hour up to two hours. Or, the patient simply gets bored or restless from being in a tight area.

Another discomforting factor is that during the MRI exam there is a harsh and loud knocking noise generated by the MRI gradient amplifier. This noise is commonly called gradient pulse, which naturally is very annoying to the patient who must endure the drone for a long period of time.

Accordingly, there is a great demand for some method of comforting the patient to keep his mind off the MRI scanning procedure. He should be entertained in some way without having the entertainment aspect detracting from the quality of the images that are being taken by the MRI technologist. Indeed, the patient should be relaxed somehow since the MRI device is formidable-looking and the patient is most likely already nervous from having to undergo such an examination.

A quick and simple solution to the entertainment problem is to provide the patient with a television to view, or a radio to listen to. But by virtue of the operating principles behind MRI technology, the exam room where the main magnet is located is permeated with very strong magnetic fields. So it is nearly impossible for a typical television, video cassette recorder (VCR), stereo, cassette player, or any electronic device to function properly in those conditions. In short, the effect of the strong magnetic field and the sensitivity of the MRI hardware to high frequency RF leakage (mainly from 10 MHz to 70 MHz) do not allow an ordinary television or audio system to function inside the magnet room (i.e., exam room).

Therefore, a need presently exists for an electronic device that can operate in the environment of an MRI magnet room to entertain a nervous patient while he or she undergoes the scanning procedure. The electronic device should also not interfere with the MRI process.

SUMMARY OF THE INVENTION

The present invention relates to an electronic entertainment device suitable for operation within strong magnetic fields. In a preferred embodiment, the present invention provides an audio and video system with properly filtered and shielded circuitry so that the system can be operated in a strong magnetic field created by MRI equipment. For the patient's benefit, the system also provides a liquid crystal display (LCD) screen for watching and a headset for listening.

The audio and video system provided by the present invention is divided between two rooms occupied by the MRI equipment. Although not part of the present invention, description of the rooms is given as background information. One room is called the control room and is where the MRI technologist controls the MRI process. The other room is the magnet or exam room, which is separated from the control room by a penetration panel, and contains the main magnet of the MRI device.

According to the present invention, the system receives an incoming RF signal through a television receiver or video cassette recorder, which then separates the RF signal into a video section signal and an audio section signal. The video section signal passes through appropriate buffering, amplifying, low pass and RF filtering circuits. The low pass filter is necessary to block out high frequency noise around the procession frequency of a hydrogen proton, which resonates during the MRI process. Next, the video section signal is conducted through the penetration panel into the magnet room where it is terminated and filtered again for noise.

Inside the magnet room, a processing circuit and LCD pixel driver then process the video section signal and send it to an LCD display screen. An optional magnifying lens system may be adapted to the LCD display screen to project the pictures on to a large reflective screen (as in a big screen TV). A patient lying prone inside the magnet bore can then watch the television pictures on the reflective screen through a pair of prism glasses worn by him.

But without the lens system, the patient views the LCD display screen directly. To facilitate viewing, a mushroom shaped hook is mounted to the LCD screen and a catch is mounted to the bore so that the LCD screen can be attached to the bore.

The audio section signal is separated into two channels, passed through an amplifier and appropriate RF filters and chokes, and fed through the penetration panel and into a pneumatic transducer inside the magnet room. The pneumatic transducer converts the electrical impulses of the audio section signal into audible sound waves.

Also provided by the present invention is a headset designed to fit the skull of the patient undergoing the MRI procedure. The headset comprises an inner set and an outer set. The inner set connects the output of the pneumatic transducer to the patient's ear, thereby bringing sounds of the television or VCR to the patient. By contrast, the outer set is circumaurel in construction so that each ear cup covers the patient's ears to block out gradient knocking noises.

Another feature of the preferred embodiment system is for the patient to be able to see and hear the MRI technologist speaking to him from the control room via the LCD display screen and headset. This is achieved by mounting a CCD (charge coupled device) camera with a microphone in the control room and using a television signal interrupt switch to turn the CCD camera and microphone on, and then patching into the television receiver. The receiver then functions as before to direct the pictures and sounds to the patient. Hence, this feature allows the patient to see and hear the technologist.

BRIEF DESCRIPTION OF THE DRAWINGS

FIG. 4 is a view of a preferred embodiment LCD video display screen.

FIG. 5 is an enlarged view of the hook mounted to the LCD display screen.

FIGS. 6A and 6B provide side and bottom views, respectively of the catch mechanism designed to engage the hook shown in FIG. 5.

DETAILED DESCRIPTION OF THE INVENTION

The following detailed description outlines an MRI compatible audio and video system having an LCD display screen. In the following description, numerous details such as specific materials and configurations are set forth in order to provide a more complete understanding of the present invention. But it is understood by those skilled in the art that the present invention can be practiced without these specific details. In other instances, well known elements are not described in detail so as not to obscure the present invention. In any event, the scope of the invention is best determined by reference to the appended claims.

General Arrangement

Figure 1:
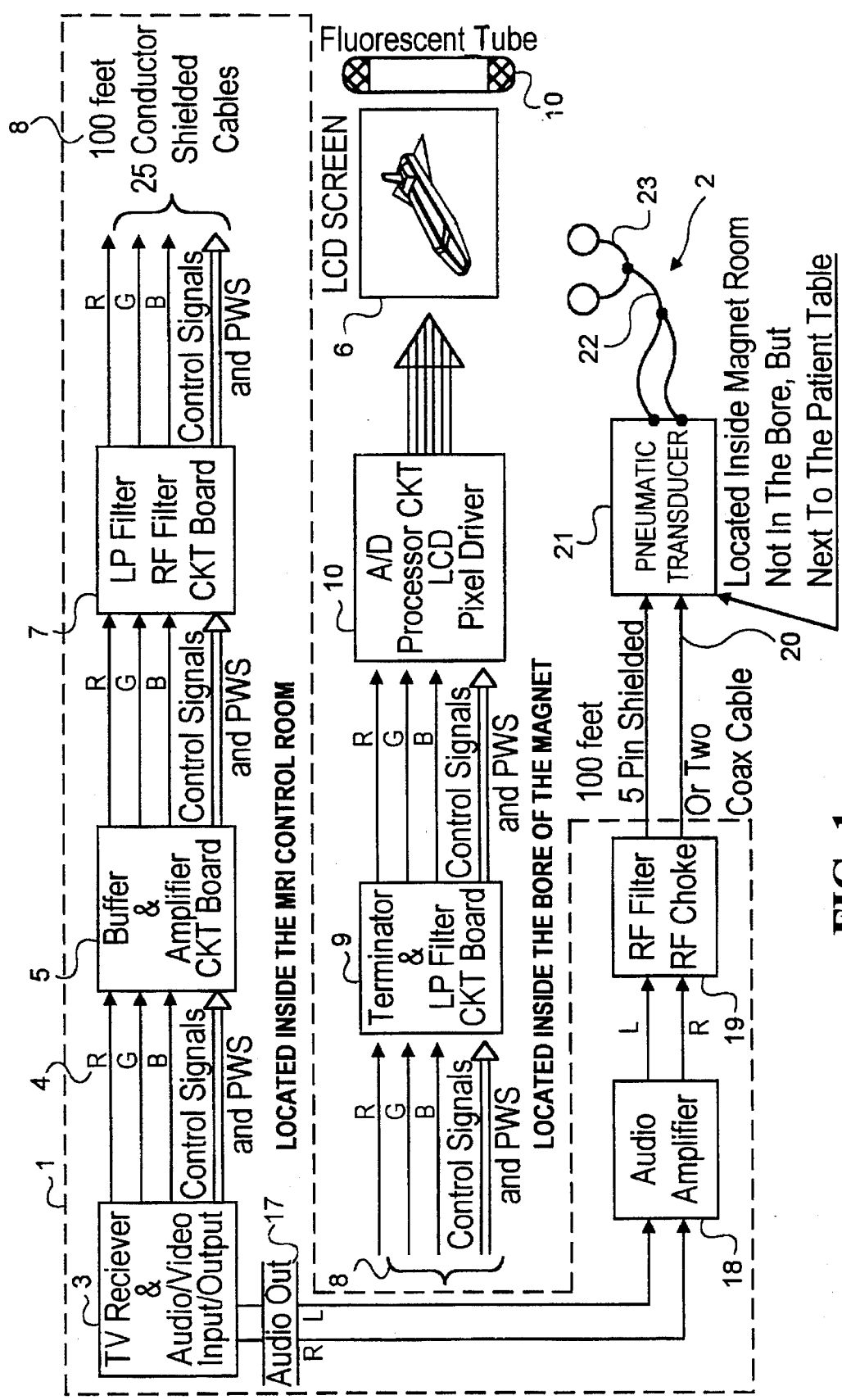
FIG. 1 is a block diagram of a preferred embodiment of the present invention illustrating the entire audio and video system separated between a control room and a magnet room

In a preferred embodiment, the present invention provides an MRI compatible audio and video system. FIG. 1 gives a general overview of how the present invention system is set up in relation to the MRI equipment, which is disposed partly in a magnet room and partly in a control room.

One portion of the present invention system is located inside the MRI control room 1. That portion of the system includes a receiver and associated electronic filters and circuitry. Dashed lines in FIG. 1 circumscribe the borders of that room. Everything outside the dashed lines represents the examination or magnet room 2. The other portion of the system that includes an LCD screen and its circuitry are located within the magnet room 2. As the name implies, the magnet room 2 contains a main magnet of the MRI device (not shown) that generates a strong magnetic field.

Continuing with the general overview, FIG. 1 shows that the system contained in the magnet room 2 is again divided such that certain parts of the system are mounted inside the bore of the main magnet (so labeled in FIG. 1) and other parts remain outside the bore. The parts inside the bore include a terminator, filter circuits, an LCD pixel driver, and an LCD screen. Of course the patient (not shown) undergoing the scanning process is positioned inside the bore, too. Outside the bore but still within the magnet room 2 is a pneumatic transducer 21 for generating sound, which is connected to a headset 23 worn by the patient.

Aside from being physically divided into two portions, the system in a preferred embodiment is separated in terms of electronics into two major sections; namely, a video section and an audio section. Each section is explained in detail below.

The Video Section (Control Room)

The video section is located partially in the control room 1 and partially in the magnet room 2, as illustrated in FIG. 1. In the control room 1, a television receiver 3 picks up an incoming RF signal through an antenna or from a video source like a video cassette recorder (VCR) player. The receiver 3 processes the incoming RF signal and separates out the sound or audio section signal 17 from the picture or video section signal 4. Since a television receiver and VCR are devices well known in the art, no detailed discussion is required here.

In the video section, the video section signal 4 is processed from the incoming RF signal in the television receiver 3 to obtain red, green, and blue chroma video signals (labeled R, G, and B in FIG. 1), and a control signal. The red, green and blue chroma signals along with the control signal, collectively labeled the video section signal 4, are sent to a buffer board 5. A power supply, well known in the art, delivers as part of the video section signal 4 a power signal (labeled PWS in FIG. 1) to the buffer circuit board 5.

At this point all the signals necessary to drive the LCD display screen 6 are present, but since the LCD screen 6 is located a distance away from the television receiver 3 (in a preferred embodiment, about 100 feet away from the television unit) the video section signal 4 needs to be amplified and buffered. Hence the need for a buffer and amplifier board 5. For some types of signals, only a unity-gain, current driver amplifier is sufficient. In this preferred embodiment, a high gain bandwidth operational amplifier is used as a buffer to drive the video section signal 4 through the approximately 100 feet. In some signals, amplification along with a driver are necessary.

A typical MRI signal is very sensitive to the electrical noise around the procession frequency of a hydrogen proton, wherein this frequency varies from 12 MHz to 80 MHz depending on the field strength of the magnet. This relationship is generally expressed as:

$$f=(42.5) \times (B)$$

wherein B is the field strength in Tesla and f is the frequency in Megahertz.

Mindful of the foregoing relationship, a filter board 7 is included to block out all other frequency above the video frequencies range, typically above 4.5 MHz. To do that, a LP filter and an RF filter are required for the filter board 7. All of the signals from the buffer board 5 have to pass through the filter board 7 before entering the magnet room 2.

As alluded to above, after leaving the filter board 7, the video section signal 4 can travel up about 100 feet before interfacing with the LCD screen 6. Thus, a 25-conductor shielded cable 8 is used to carry the video section signal 4 for that distance.

In an alternate embodiment (not shown), a fiber optic cable may be used in place of the shielded cable 8. Further, a fiber optic generator is added to the filter board 7 to convert the electrical video section signal 4 to optical impulses to be carried by the fiber optic cable. In this embodiment, the terminator board 9 is not required. In its place is a fiber optic receiver to decode and convert the optical impulses into electrical signals.

The Video Section (Magnet Room)

The 25-conductor shielded cable 8 is fed into the magnet room 2 where the other part of the video section is located. But first, the cable 8 must pass through a penetration panel (not shown) separating the magnet room 2 from the control room 1. In the magnet room 2, the incoming video section signal 4 from the 25-conductor shielded cable 8 is terminated with the proper load resistor 9 known in the art. Appropriate filters are also provided on that same circuit board 9 to eliminate the effects of RF signals and gradient noise from the MRI equipment upon the video section signal 4, and vice versa.

The video section signal 4 next proceeds to circuit board 10. Here, the incoming analog and digitized signal 4 from the terminator and filter board 9 is processed and fed into an LCD pixel driver circuit 10. The output of the processor circuit and pixel driver 10 is sent to the LCD display screen 6. As seen in FIG. 1, located just behind the LCD screen 6 is a light source 10 such as a fluorescent tube to supply backlighting for the picture on the LCD screen 6. Naturally, other means of backlighting known in the art are possible. FIG. 4 provides a more detailed view of the LCD display screen 6.

Mounting the LCD Display Screen

According to the present invention, placement of the LCD display screen 6 is important. There are basically two different ways of positioning a patient inside the main magnet bore for an MRI exam; he can be positioned inside the bore either with his head in first or with his feet in first. Needless to say, this complicates the way the LCD display screen 6 can be oriented. For instance, the LCD display screen 6 cannot be mounted in a horizontal plane if the patient goes into the bore feet first because the picture on the LCD display screen 6 would appear upside down to him. Of course the screen 6 would then have to be rotated 180° along a vertical axis of rotation to obtain an upright image.

Fortunately, most of the MRI devices on the market already have a built-in reflection mirror inside the magnet bore. With this mirror, the patient can see outside of the bore along a horizontal axis as he lies on his back on a patient carriage oriented head first in the magnet bore. To take advantage of the orientation of the patient, the present invention provides that the LCD display screen 6 be mounted vertically a quarter of the distance inside the magnet bore. When the patient is placed inside the magnet head first, he can see the LCD display screen 6 through its reflection in the mirror. If the patient enters the magnet bore feet first, he has a direct view of the LCD display screen 6 if the screen 6 is pivoted around a vertical axis.

FIGS. 4, 5, 6A and 6B illustrate the means by which the LCD display screen 6 is held in position inside the magnet bore. In this preferred embodiment, a mushroom shaped hook 12 extends from the top of the LCD display screen 6 as depicted in FIG. 4. The display screen 6 in FIG. 4 is tilted slightly to reveal the placement of the hook 12. FIG. 5 shows an enlarged view of the mushroom-shape hook 12. As the name implies, the hook 12 has a round shaft 13 capped at one end by a circular dome 14. A catch 15, shown in FIGS. 6A and 6B, mounted to the bore is designed to receive the hook 12 of the LCD screen 6, holding the screen 6 up in the bore. It can be seen that the large dome 14 of the hook 12 slides into the dovetail opening 16 of the catch 15. Moreover, the hook 12 is designed to rotate, slide or disengage if the LCD display screen 6 is accidentally knocked along a horizontal direction, thus avoiding any damage to the LCD screen 6 Alternatively, the LCD screen 6 can be mounted to the bore with something as simple as a hook and pile fastener (i.e., Velcro).

The Audio Section

The next part of the system as provided in the preferred embodiment of the present invention is an audio section that enables the patient to hear the signal from the television receiver 3. Going back to FIG. 1, the television receiver 3 separates out the audio section signal 17 from the received RF signal in a manner known in the art. Next, the audio output from the receiver 3 is separated into two channels for left and right stereo imaging (labeled L and R in FIG. 1), then amplified through a dedicated audio amplifier 18 with a volume control.

The output of the audio section signal 17 from the audio amplifier 18 needs to be filtered to block out electromagnetic interference having a frequency above 20 kHz. Therefore, the present invention provides an appropriate RF filter and RF choke 19 to block out the unwanted electrical noise, obtaining approximately −50 dbA attenuation for all frequencies above 5 MHz. The outputted audio section signal 17 is then conducted into the magnet room 2 through an audio cable 20 that passes through the penetration panel. In a preferred embodiment, the audio cable 20 can be about 100 feet in length of either a five-pin shielded conductor, or two separate coaxial cables. Optical fiber technology may also be incorporated herein to conduct the audio section signal 17 too.

The magnet room 2 where the patients undergo the MRI procedure is completely shielded for RF signals. As mentioned above, the magnet room 2 features a penetration panel that helps shield out unwanted RF signals. Any cable that goes into the magnet room 2 must pass through the penetration panel. As a result, all of the audio and video signals have to be RF shielded and passed through a low pass filter before going through the penetration panel and into the magnet room 2.

Inside the magnet room 2, the audio cable 20 is connected to a box containing a pneumatic transducer 21 to convert electrical impulses of the audio section signal 17 into audible sound waves (i.e., pneumatic impulses). The pneumatic transducer 21 can be made in several different ways. In the preferred embodiment, piezoelectric speakers known in the art are ideal since they utilize the piezoelectric effect and are non-magnetic. Thus, the function of the speaker is not affected by the main magnet.

The sound waves generated by the transducer 21 are conveyed through a hollow tube 22 connected at one end to a headset 23 worn by the patient. In the preferred embodiment, the tubing 22 is made from a flexible polymer material, has a ⅛th inch inside diameter, and extends about 36 inches long. Clearly, there are many other possible methods known in the art of conducting audible sound from the transducer to the headset, of which plastic tubing is only one.

Another acceptable pneumatic transducer is a small, full-range speaker packaged in a manner such that its cone driver faces and abuts the plastic tubing to transfer the sound to the headset. Yet another type of pneumatic transducer is a 4" mid-range driver, model LM1824, manufactured by Electro Voice. This type of driver is configured into a horn where the sound is emitted out of a one-inch diameter opening. The opening can be adapted to a one-half inch diameter plastic tubing which conducts the sound waves to the patient. With this specific horn speaker design, however, the speaker has to be mounted outside of the magnet room because this particular horn driver has a large magnet that might be disrupted by the main magnet of the MRI imager.

The Headset

The audible sound waves from the pneumatic transducer 21 propagate through the hollow tube 22 and into a headset 23. As mentioned above, during the MRI procedure, data is usually collected by a high current RF signal called a gradient pulse. Gradient pulse causes an audible and loud knocking noise that tends to be very annoying to the patient. To overcome this problem, the present invention provides a specially designed headset 23 to block the gradient noise by 21 decibels or approximately 92% attenuation from its original level.

Figure 2A:
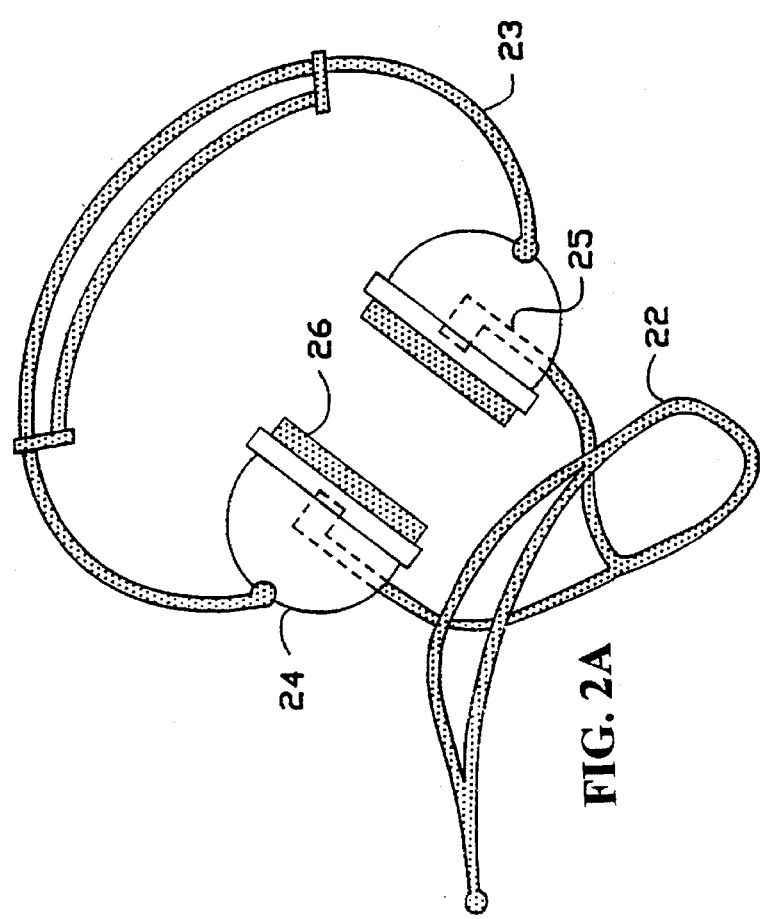
FIGS. 2A and 2B illustrate a headset provided by the present invention and a supplemental side view of an ear cup of the headset.
Figure 2B:
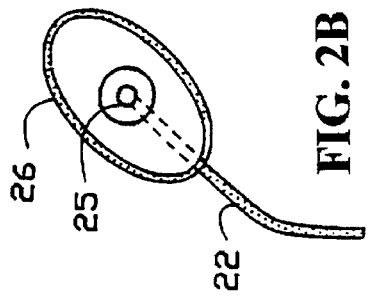

According to the present invention, the diagrams in FIGS. 2A and 2B show a preferred embodiment headset 23. The two major parts of the headset 23 are an outer set 24 and an inner set 25. The outer set 24 is similar to the ear muff type headsets used at gun ranges. That particular design is intended to muffle the loud crack or sound impulse generated by a discharging gun. The outer set 24 as provided by this preferred embodiment has ear cups 26 (shown in a supplemental side view in FIG. 2) that are circumaural, meaning that the ear cups 26 completely enclose each ear. The ear cups 26 are all plastic and have very soft and comfortable cushions that conform to the side of the patient's head while sealing out external sounds. Also, the headpiece is adjustable and the ear cups 26 are hinged to ensure a proper fit around the patient's skull. In sum, the outer set 24 by virtue of its circumaural design blocks out the gradient knocking noise.

Figure 3:
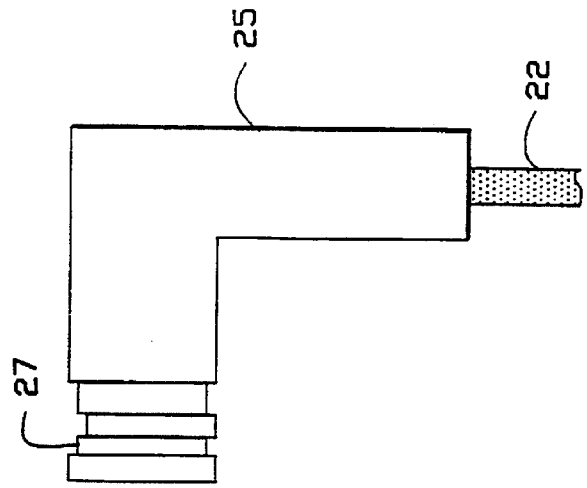
FIG. 3 provides a magnified view of an ear tip component of the inner set.

Disposed inside the outer set 24 is the inner set 25, to which the tubing 22 conducting the sound waves is connected. As shown in FIG. 3, the inner set 25 is configured somewhat like the headsets rented out to passengers by airlines on long distance flights. The basic inner set 25 has an L shape so that its eartip 27 easily hooks into the patient's ear canal while its base connects with the tubing 22. Operating together, the outer set 24 blocks out any gradient knocking noise while the inner set 25 supplies to the patient soothing sounds broadcast from the receiver 3.

In an alternate embodiment, the present invention is modified with an array of magnifying lenses (not shown) disposed adjacent to the LCD display screen. A reflective screen is set up a distance away from the lenses but aligned therewith. In this manner, the pictures on the LCD display screen are projected through the lenses onto the larger reflective screen. In effect, a big screen TV effect can be obtained for easier viewing by the patient.

Many other modifications are possible. For example, a volume control, VCR controls, along with a television channel control could be accessed remotely from the patient's end through a means known in the art. In the same vein, even a panic switch for the patient could be adapted to the system. This way, if the patient has an emergency, he can immediately signal the MRI technologist through a remote controller. One such controller is a handheld infra-red remote controller well known in the art that could be easily adapted by one having ordinary skill in the art to incorporate all of the above-mentioned functions.

In another alternate embodiment, the system may be modified for the patient to be able to see and hear the MRI technologist in the control room via the LCD display screen and headset as the technologist talks to him. This is achieved by mounting a CCD (charge coupled device) camera and a microphone in the control room and using an RF signal interrupt switch in the television, known in the art, to turn the CCD camera and microphone on. The pictures and sounds are then supplied to the patient's LCD display screen and headset in the same manner as described for the preferred embodiment audio and video section signals.

In yet another alternate embodiment, the present invention provides that one cable from the television receiver or VCR located outside the magnet room be passed through the penetration panel. Along with video signal, the cable could carry the power source signal for the television processor/pixel driver circuit and the buffer circuit board. The buffer board and the television processor circuit are both kept in the magnet room inside an RF shielded enclosure, which connects with the incoming cable. An outgoing cable from the shielded enclosure then conducts the signals to the LCD display screen.

An advantage of the foregoing alternate embodiment is that only one filter is required for the video section signal and one filter for the power supply. By contrast, the preferred embodiment requires about twenty filters. Also, it is much easier to install since this embodiment can be adapted to use the RG 58 coaxial cable typically already connected to the penetration panel. No opening has to be cut into the panel to provide access for other cables.

Unfortunately, the buffer board and associated filters for this alternate embodiment might create spurious RF signals that adversely affect the ongoing MRI imaging scan. Indeed, the quality of the patient scan image may be adversely affected by such RF signal leaks.

What is claimed is:

1. An audio system for a patient disposed within a magnetic resonance imaging device having a magnetic field, said magnetic resonance imaging device comprising a control room and a magnet room separated by a penetration panel, said magnet room comprising a main magnet having a bore, said audio system comprising:

an incoming signal comprising an audio signal portion;

means for preventing said audio signal portion from interfering with the magnetic resonance imaging device;

an audio transducer for converting said audio signal portion into audible sound waves;

a hollow tube connected to said audio transducer; and a magnetically inert headset connected to said hollow tube, said headset comprising an inner set portion adapted to abut a human ear canal to conduct the audible sound waves thereto and disposed inside an outer set portion, wherein the outer set portion is adapted to cover the human ear to block out audible sound, and wherein said outer set portion further comprises an ear cup which substantially completely encloses the ear.

2. The system of claim 1, wherein said ear cup comprises a soft cushion.

3. The system of claim 1, wherein said audio transducer comprises a magnetically inert transducer located within the magnet room.

4. The system of claim 2, wherein said audio transducer comprises a magnetically inert transducer located within the magnet room.

5. The system of claim 3, wherein said magnetically inert transducer comprises a piezoelectric transducer.

6. The system of claim 4, wherein said magnetically inert transducer comprises a piezoelectric transducer.

7. The system of claim 5, wherein said means for preventing comprises a low pass filter.

8. The system of claim 6, wherein said means for preventing comprises a low pass filter.

* * * * *